(12) United States Patent
Chen et al.

(10) Patent No.: US 10,128,313 B2
(45) Date of Patent: Nov. 13, 2018

(54) NON-VOLATILE MEMORY DEVICE AND STRUCTURE THEREOF

(71) Applicant: TAIWAN SEMICONDUCTOR MANUFACTURING COMPANY LTD., Hsinchu (TW)

(72) Inventors: Chi-Tsai Chen, Taichung (TW);
Wenhsien Kuo, Hsinchu (TW);
Meng-Chun Shih, Hsinchu (TW);
Ching-Huang Wang, Taoyuan County (TW); Chia-Fu Lee, Hsinchu (TW);
Yu-Der Chih, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/017,185

(22) Filed: Feb. 5, 2016

(65) Prior Publication Data
US 2017/0229515 A1    Aug. 10, 2017

(51) Int. Cl.
*H01L 27/24* (2006.01)
*G11C 13/00* (2006.01)
*H01L 45/00* (2006.01)

(52) U.S. Cl.
CPC ...... *H01L 27/2436* (2013.01); *G11C 13/0002* (2013.01); *G11C 13/003* (2013.01); *G11C 13/004* (2013.01); *G11C 13/0007* (2013.01); *G11C 13/0069* (2013.01); *H01L 27/2409* (2013.01); *H01L 27/2418* (2013.01); *H01L 45/146* (2013.01); *H01L 45/147* (2013.01); *G11C 2013/0083* (2013.01); *G11C 2213/72* (2013.01); *G11C 2213/74* (2013.01); *G11C 2213/79* (2013.01); *G11C 2213/82* (2013.01); *H01L 27/2463* (2013.01); *H01L 45/08* (2013.01); *H01L 45/1233* (2013.01)

(58) Field of Classification Search
CPC . H01L 45/08; H01L 27/2436; H01L 27/2409; H01L 27/2418; H01L 45/146; H01L 45/147; G11C 13/0007; G11C 13/004; G11C 13/0069; G11C 13/0002; G11C 13/003
USPC ............................................................ 257/2
See application file for complete search history.

(56) References Cited

U.S. PATENT DOCUMENTS

| | | | |
|---|---|---|---|
| 8,274,068 B2 | 9/2012 | Nagashima | |
| 2011/0049465 A1* | 3/2011 | Nagashima | H01L 27/0207 257/5 |
| 2011/0096595 A1 | 4/2011 | Terai | |

(Continued)

*Primary Examiner* — Stephen Bradley
*Assistant Examiner* — Patricia Reddington
(74) *Attorney, Agent, or Firm* — WPAT, P.C., Intellectual Property Attorneys; Anthony King (57) ABSTRACT

In the present disclosure, a non-volatile memory cell comprises a data storage unit, a selection unit and a switching unit. The data storage unit is configured to store an information bit and has a first end and a second end. The first end is coupled to a bit line. The selection unit is configured to access the data storage unit, and the selection unit has a first end coupled to a select line, a second end coupled to the second end of the data storage unit, and a third end coupled to a source line. The switching unit is configured to perform a formation operation and has a first end coupled to a forming line and a second end coupled to the second end of the data storage unit.

20 Claims, 6 Drawing Sheets

(56) References Cited

U.S. PATENT DOCUMENTS

| | | |
|---|---|---|
| 2012/0220087 A1* | 8/2012 | Suh .................. H01L 27/105 |
| | | 438/238 |
| 2012/0327702 A1 | 12/2012 | Takagi |
| 2013/0009124 A1 | 1/2013 | Chang |
| 2013/0208526 A1 | 8/2013 | Chung |
| 2013/0270508 A1 | 10/2013 | Li et al. |
| 2014/0177330 A1* | 6/2014 | Ting ................ H01L 29/66272 |
| | | 365/174 |
| 2014/0241038 A1* | 8/2014 | Terai .................. H01L 45/08 |
| | | 365/148 |
| 2017/0154925 A1* | 6/2017 | Shimabukuro ....... H01L 27/249 |

* cited by examiner

NON-VOLATILE MEMORY DEVICE AND STRUCTURE THEREOF

BACKGROUND

Non-volatile memory is a type of memory that is capable of retrieving information bits even after electrical power is turned off and back on again. The non-volatile memory has attracted much attention during the last several years over traditional hard-disk storage media, such as magnetic tapes and compact discs (CDs). Among numerous types of non-volatile memory, resistive type non-volatile memory is regarded as a promising memory technology for its fast access time and high device density. However, the development of resistive non-volatile memory may encounter challenges in device miniaturization. The performance metrics, such as power, operation time and cycling endurance, all need to be taken into account when desired device dimensions continue to shrink.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive type non-volatile memory, or resistive random access memory (RRAM), is configured as one type of non-volatile memory which stores data logical states in embedded variable resistance elements. However, existing RRAM technology has encountered manufacturing challenges as the device geometric size continues to decrease. Meanwhile, the operational voltage and current should be reduced along with the downsizing of element and feature. Otherwise, an excess formation voltage level used for forming an RRAM cell may damage the memory structure. The situation would get more severe for thinner device features because voltage stress sustainability becomes weaker under more advanced fabrication processes such as 28 nm process or beyond.

In view of the above-mentioned issues, an improved RRAM architecture is discussed in the present disclosure. The proposed RRAM cell can be implemented with advanced process flows while keeping the sustainability at high formation voltage level. The device footprint is kept small and the manufacturing process is compatible with the current mainstream process flows. The cycling endurance can be effectively increased and the performance of the RRAM is thus enhanced.

Figure 1:
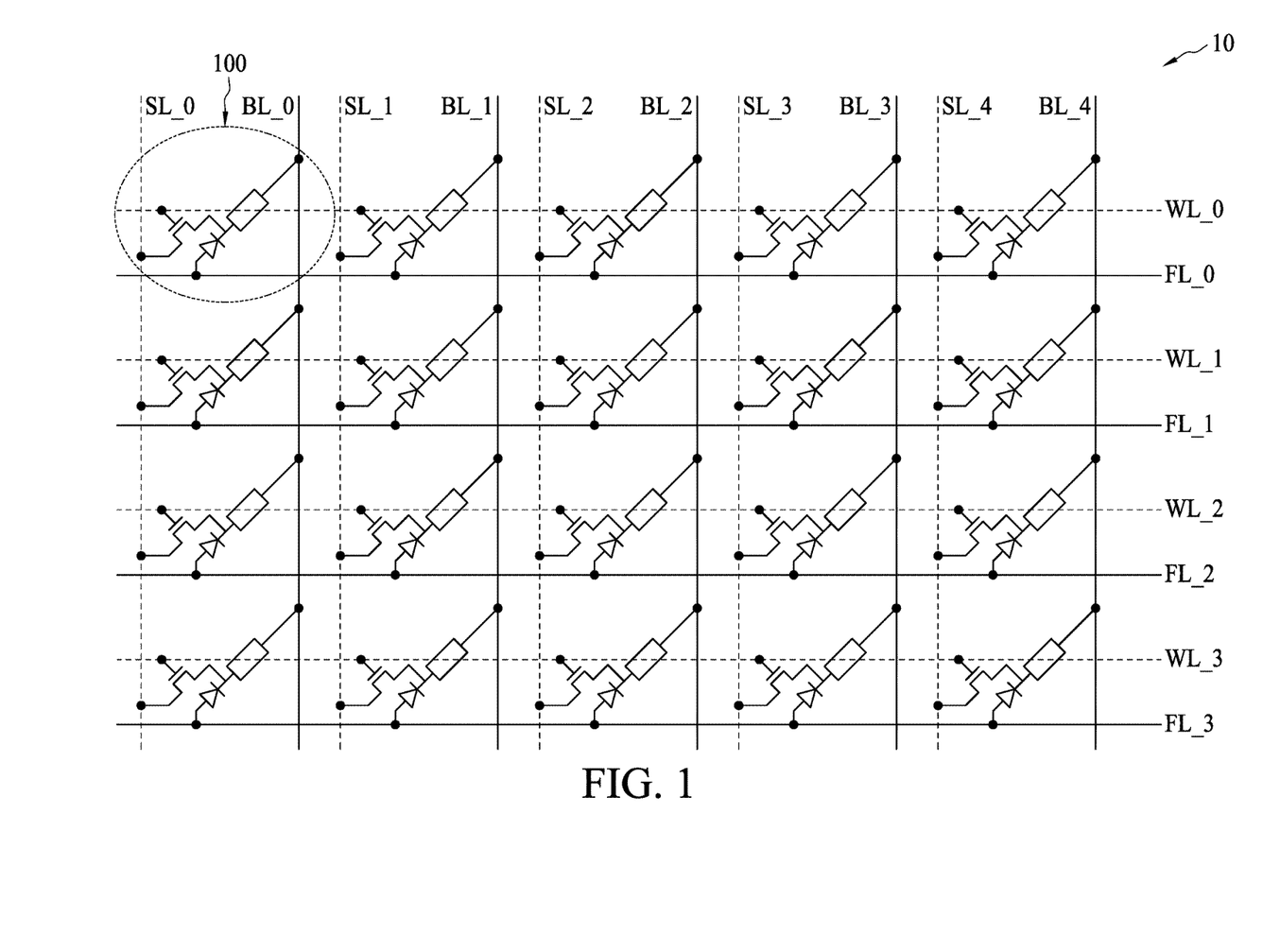
FIG. 1 shows a schematic diagram of a non-volatile memory array in accordance with some embodiments.

FIG. 1 shows a schematic diagram of a non-volatile memory array 10 in accordance with some embodiments. Referring to FIG. 1, the non-volatile memory array 10 comprises a plurality of non-volatile memory cells arranged in rows and columns. For illustration, only four rows and five columns are shown. Further, an exemplary non-volatile memory cell 100 is shown on the top left corner of the memory array 10. In addition, the non-volatile memory array 10 comprises a plurality of bit lines BL0 through BL4, a plurality of source lines SL0 through SL4, a plurality of select (word) lines WL0 through WL3, and a plurality of forming lines FL0 through FL3. Each of the non-volatile memory cells comprises four terminals electrically coupled to the respective bit line, source line, select line and forming line. For example, the memory cell 100 is coupled to the bit line BL0, the word line WL0, the source line SL0 and the forming line FL0. The number of rows or columns is for illustration only, and any other number of rows or columns is also within the contemplated scope of the present disclosure.

Figure 2A:
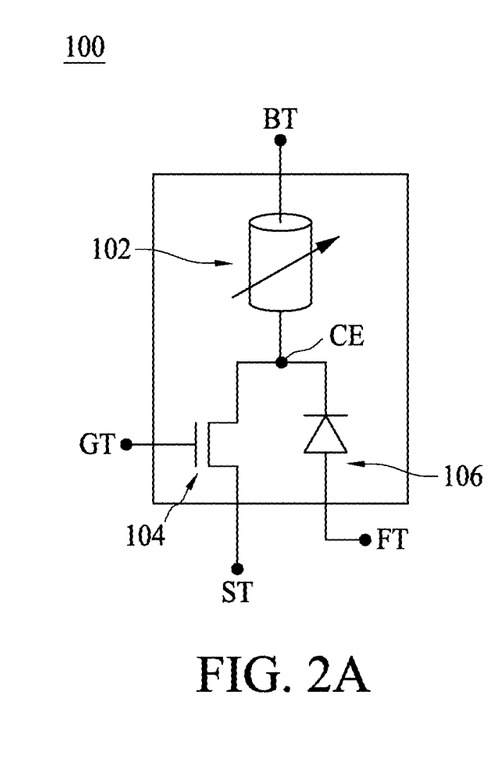
FIG. 2A shows a circuit diagram of a non-volatile memory cell in accordance with some embodiments.

FIG. 2A shows a circuit diagram of the non-volatile memory cell 100 of FIG. 1 in accordance with some embodiments. Referring to FIG. 2A, the non-volatile memory cell 100 is configured to store an information bit or bits, which can be accessed through appropriate operations. The non-volatile memory cell 100 comprises a data storage unit 102, a selection unit 104 and a switching unit 106. In the following embodiments, the structures or functions of the non-volatile memory array 10 are described and illustrated on the basis of the memory cell 100 for simplicity.

As shown in FIG. 2A, the non-volatile memory cell 100 includes a bit line terminal (BT), a gate terminal (GT), a source terminal (ST) and a forming terminal (FT). The data storage unit 102, the selection unit 104 and the switching unit 106 are joined at a common end CE. Further, the data storage unit 102 comprises a first end coupled to the bit line BL0 at the bit line terminal (BT). Also, the data storage unit 102 comprises a second end coupled to the selection unit 104 and the switching unit 106. The data storage unit 102 is configured to store one or more information bits accessible by the selection unit 104. In addition, the data storage unit 102 comprises a variable resistance element to retain the information bits. Moreover, the data storage unit 102 is configured to receive an access voltage level such as a set voltage level or a reset voltage level to change the resistance during an access operation. The data storage unit 102 is capable of keeping the resistance value even in the absence of supply power, thereby constituting a non-volatile memory device in conjunction with the selection unit 104 and the switching unit 106.

The selection unit 104 is configured to select (activate) a non-volatile memory cell of interest from the memory array 10. Furthermore, the selection unit 104 is configured to perform a read or write operation against the data storage unit 102 in response to a write voltage level. In an embodiment, the selection unit 104 is configured to provide binary voltage levels, i.e., a set voltage level and a reset voltage level, corresponding respectively to a logical '0' or '1' state, to the data storage unit 102.

The selection unit 104 comprises a first end serving as the gate terminal (GT), a second end coupled to the second end of the data storage unit 102, and a third end serving as the source terminal (ST). In some embodiments, the selection unit 104 comprises a transistor. For example, the selection unit 104 may be implemented by a P-type or N-type metal oxide semiconductor (MOS) transistor. In the present embodiment, the selection unit 104 is an N-type MOS transistor. Further, the gate terminal (GT) of the transistor 104 is coupled to the word line WL0 of the memory array 10. Also, the source terminal (ST) of the transistor 104 is coupled to the corresponding source line SL0, and a drain terminal of the transistor 104 is coupled to the data storage unit 102 at the common end CE. Although a MOS transistor is used in the present embodiment, other suitable devices and circuitries, such as a bipolar junction transistor (BJT), are also within the contemplated scope of the present disclosure.

The switching unit 106 comprises a first end coupled to the forming line FL0 at the forming terminal (FT). Also, the switching unit 106 comprises a second end coupled to the second end of the data storage unit 102. As far as functionality is concerned, the switching unit 106 is used as a conducting element in a formation operation of the data storage unit 102. In other situations, the switching unit 106 may be turned off in order to avoid unintended conduction of the data storage unit 102. In some embodiments, the switching unit 106 may also be configured to access the data storage unit 102 just like the selection unit 104. In either case, the switching unit 106 may not be operating simultaneously with the selection unit 104. For example, when the switching unit 106 is configured to form or access (e.g., write or read) the data storage unit 102, at least one terminal of the selection unit 104 is floated so that the selection unit 104 is turned off. In contrast, when the selection unit 104 is configured to access the data storage unit 102, at least one terminal of the switching unit 106 is floated so that the switching unit 106 is turned off.

In some embodiments, the switching unit 106 comprises a diode such as a PN-junction diode, PIN diode, and Schottky diode. In some embodiments, the switching unit 104 includes an MIM (Metal-Insulator-Metal) or an SIS (Silicon-Insulator-Silicon) device. In some embodiments, a barrier metal layer or an adhesive layer is inserted within aforementioned devices.

Figure 2B:
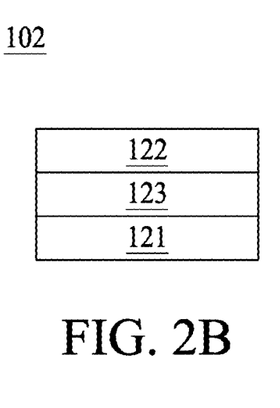
FIG. 2B shows a block diagram of a data storage unit for the non-volatile memory cell of FIG. 2A, in accordance with some embodiments.

FIG. 2B shows a block diagram of the data storage unit 102 of FIG. 2A. Referring to FIG. 2B, the data storage unit 102 comprises a first electrode 121, a second electrode 122 and a variable resistance layer 123 between the first electrode 121 and the second electrode 122. In an embodiment, the first electrode 121 serves as a top electrode, and forms a bit line terminal among the four terminals of the memory cell 100. In addition, the second electrode 122 serves as a bottom electrode, which is also the common end CE, and is coupled to the selection unit 104 and the switching unit 106.

The first electrode 121 comprises conductive materials such as Pt, Au, Ag, TiAlN, SrRuO, Ru, RuN, Ir, Co, Ti, TiN, TaN, LaNiO, Al, PtIrOx, PtRhOx, Rh, TaAlN, W and other suitable materials. The second electrode 122 comprises conductive materials such as W, WN, TaN, TiN, Pt, Cu, TiAlN, TaSiN, TaSi2, TiC, TaC, and Nb—TiO2 and other suitable materials. In an embodiment, the first electrode 121 may be made from a material similar to the material used in the second electrode 122 or vice versa.

The variable resistance layer 123 is configured based on a current or voltage received from the first electrode 121 and the second electrode 122. The variable resistance layer 123 may comprise perovskite materials such as PCMO ($Pr_xCa_{1-x}MnO_3$), YBCO ($YBa_2Cu_3Oy$) or GBCO ($GdBaCoxOy$). In some embodiments, the variable resistance layer 123 may include polycrystalline of $NiO_x$, (x=1 or 1.5), $V_2O_5$, ZnO, $Nb_2O_5$, $TiO_2$, $HfO_2$, HfAlO, $AL_2O_3$, $WO_3$, CoO, $Ta_2O_5$ and other suitable materials.

The following table 1 shows exemplary operations for the resistive non-volatile memory cell 100. The operations include a formation operation, write operations, and read operation.

| Node | Formation 1 | Formation 2 | Set | Reset | Read |
|------|-------------|-------------|-----|-------|------|
| WL   | float       | float       | V1  | V1    | V2   |
| BL   | 0           | V5          | V3  | 0     | V4   |
| SL   | float       | float       | 0   | V6    | 0    |
| FL   | V5          | 0           | float | float | float |

In a formation operation, the data storage unit 102 receives a forming voltage level, for example, an electrical pulse applied across two ends thereof. Furthermore, the formation voltage level may range from about 2.8 volts to 7 volts, such as 3.5 volts. Then a conduction path (also called a filament path) is established within the variable resistance layer 123. The conduction path is formed due to defects in the variable resistance layer 123, known as oxygen vacancies (removed oxygen locations in an oxide bond). Thus, a non-conductive metal oxide in the variable resistance layer 123 exhibits electrically resistive properties by a formation process. After the formation process, the data storage unit 102 is capable of switching between different resistance states. In a formation operation, the selection unit 104 is protected from a relatively high forming voltage level. In an embodiment, the source line SL0 or the word line WL0 is floated in forming the data storage unit 102.

The formation operation may be divided into two types. In the first type (formation-1) operation, as shown in table 1 and FIG. 2A, an anode end of the switching unit 106 is coupled to the forming line FL0 and a cathode end of the switching unit 106 is electrically coupled to the data storage unit 102. Then, a positive formation voltage level V5 is applied to the data storage unit 102 from the forming line FL0 through the switching unit 106 while the bit line BL0 is grounded. Alternatively, as is illustrated and will be described later with reference to FIG. 3A, the switching unit 106 may be flipped such that an anode end is coupled to the data storage unit 102. Consequently, a second type formation-2 operation can be performed in which a forming voltage level is received from the bit line BL0 while the forming line FL0 is grounded. Both types of forming operations adopt similar forming voltage levels for substantially the same durations and achieve comparable forming performances.

The formation operation illustrated above is referred to as a row-based formation. In that scenario, each non-volatile memory cell, such as the memory cell 100, on the same row of the memory array 10 is configured with substantially the same voltage setting. Alternatively, when a single memory cell in a row is formed in a forming operation, the remaining memory cells receive a voltage drop lower than a required forming voltage level. Thus, these memory cells not to be formed do not undergo the formation operation. Take the formation-1 type as an example. An inhibition voltage level greater than zero volt, such as 0.3 volt, is applied to the bit lines BL1 through BL4. Thus, except the non-volatile memory cell 100, the remaining cells are not subjected to the forming operation.

In a write operation, the variable resistance layer 123 may be configured to be a high resistance state (HRS) by a reset operation. Further, the variable resistance layer 123 may be configured to be a low resistance state (LRS) by a set operation. In a set operation, when a memory cell 100 is selected, the respective selection unit 104 is turned on in response to a set of appropriate operation voltage level s. For example, the gate terminal may receive a word line voltage level $V_{WL}=V1$ as a select voltage level of about 1.2 volts, the bit line terminal may receive a bit line voltage level $V_{BL}=V3$ of about 1.2 volts and the source terminal may be grounded. In contrast, in a reset operation, the gate terminal receives a word line voltage level V1 as a select voltage level of about 1.4 volts, the source terminal may receive a source line voltage level $V_{SL}=V6$ of about 1.4 volts and the bit line voltage is grounded. In the present embodiment, the voltage polarities across the data storage unit 102 are opposite for the set and reset operations for a bipolar variable resistance layer 123. Alternatively, in some embodiments, the voltage polarities for an access operation may be the same for a unipolar variable resistance layer 123.

In a read operation, the selection unit 104 is turned on to determine the logical value stored in the data storage unit 102 by detecting the resistance of the variable resistance layer 123. It is accomplished by supplying a predetermined voltage level, measuring the current in the data storage unit 123 and then comparing the current value with a predetermined value. The word line voltage level may be set as the power supply voltage level, i.e., V2=VDD of about 1 volt. The bit line voltage level may be determined as V4=0.2 volts.

In the present embodiment, the selection unit 104 is floated during the formation operation. For example, the word line terminal WL0 and/or the source line terminal SL0 for the memory cell 100 at issue may be floated. The forming current passing through the data storage unit 102 is directed to only the switching unit 104 in the forming process. It is understood that a normal forming voltage level would reach as high as 3.5 volts or even 7 volts, depending on the forming methods and the compositions of the data storage units. Such forming voltage level would not cause problems if an appropriate switching unit 106 is chosen. However, the operation voltages of the selection unit 104 are set to be lower than the forming voltage level s. In addition, the breakdown voltage of the gate oxide in the gate region would decrease as the thickness of the gate oxide decreases. As the device size continues to shrink, the thickness of the gate region is made ever thinner. Thus, a forming voltage level such as 3.5 volts may be much higher than the operation voltage level (for example, 1.2 volts) of the selection unit 104, and may adversely affect the endurance of the selection unit 104.

An existing method tries to eliminate the problem by increasing gate oxide thickness. However, the manufacturing process would inevitably become more complicated, which compromises the benefits of the device miniaturization. An alternative approach is to use an I/O transistor with a larger footprint as a replacement. Yet it still fails in reducing the memory cell size and maintaining the access speed. Other existing approaches include modifications of the variable resistance layer 123 and the structure of the data storage units 102 in order to lower the required forming voltage level. However, considerable efforts are needed for improving the compositions and manufacturing processes that may prolong the design cycle and increase the cost. In view of the above, a desired balance between performance and design complexity has not been found in the existing methods or approaches.

In the present disclosure, the switching unit 106 and the selection unit 104 are configured to take care of the forming operation and access operation separately. A high voltage or large current used in the forming operation, which would otherwise apply to a selection transistor in an existing method, is directed to the switching unit 106. The switching unit 104 is configured to receive a high forming voltage level in an economical and efficient structure. Additionally, during the forming operation, the selection unit 104 may be configured to be electrically isolated from the switching unit 106 for overvoltage protection. In an embodiment, the selection unit 104 is floated to prevent the forming voltage level from applying thereto. After the completion of the formation operation, the selection unit 104 is electrically decoupled or floated. The accessing activities of the memory cell 100 are conducted by only the selection unit 104. Effectively, a better write and read performance is achieved. The geometric size can be further decreased without significantly changing the current process flow. An efficient design cycle with competent product cost may thus be obtained.

An existing resistive non-volatile memory architecture may adopt a one-transistor and one-resistor (so-called 1T1R) configuration. In addition, a one-diode and one-resistor (so-called 1D1R) configuration may also be used in a resistive non-volatile memory cell. In the present disclosure, a one-transistor, one-diode and one-resistor (named as 1T1D1R herein) configuration type is shown. The 1T1D1R resistive non-volatile memory cell 100 operates in conjunction with the word line WL0, source line SL0, bit line BL0 and forming line BL0. Hence, the four terminals of the 1T1D1R resistive non-volatile memory cell 100 can be controlled separately, and thus the forming operation and access operation can be performed separately.

Figure 2C:
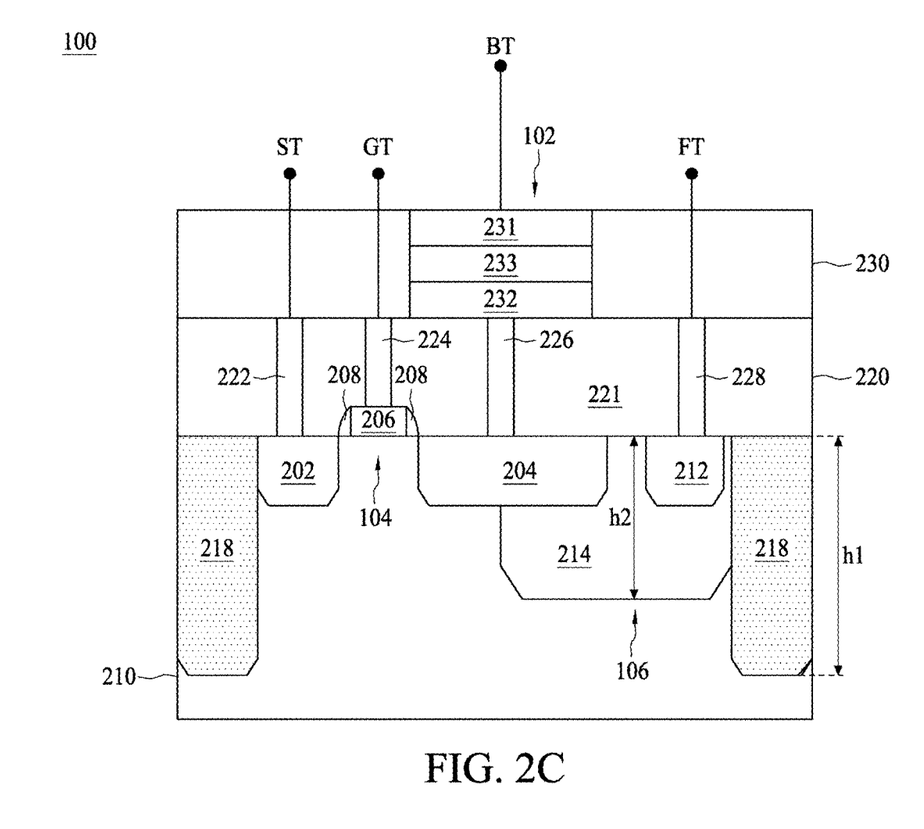
FIG. 2C shows a cross-sectional diagram of the non-volatile memory cell of FIG. 2A, in accordance with some embodiments.

FIG. 2C shows a cross-sectional diagram of the non-volatile memory cell 100 in FIG. 2A, in accordance with some embodiments. Referring to FIG. 2C, the non-volatile memory cell 100 comprises a semiconductor substrate 210, a first layer 220 and a second layer 230. Moreover, areas corresponding to the data storage unit 102, the selection unit 104 and the switching unit 106 described and illustrated with reference to FIG. 2A are labeled. In addition, connections to the bit line terminal BT, the gate terminal GT, the source terminal ST, and the forming terminal FT described and illustrated with reference to FIG. 2A are also identified. The non-volatile memory cell 100 further comprises a first S/D region 202, a second S/D region 204, a gate region 206, sidewall spacers 208, isolation features 218, a first doped region 212, a lightly doped region 214, conductors 222, 224, 226 and 228, a first electrode layer 231, a second electrode layer 232 and a variable resistance layer 233.

The semiconductor substrate 210 includes a semiconductor material such as silicon, silicon germanium, or the like. Semiconductor substrate 210 may be lightly doped with a p-type impurity and serves as a P-type silicon substrate (P-substrate). Alternatively, the semiconductor substrate 210 can also be doped with an N-type impurity so as to serve as an n-type silicon substrate (n-substrate). In some embodiments, the semiconductor substrate 210 includes an elementary semiconductor such as silicon or germanium in a crystal, polycrystalline, or amorphous structure. In other embodiments, the semiconductor substrate 210 may be a compound semiconductor such as GaAs, GaP, SiC, InP, InAs, or InSb. In yet other embodiments, the semiconductor substrate 210 may be an alloy semiconductor such as SiGe, GaAsP, AlGaAs, AlInAs, GaInAs, GaInP, GaInAsP or any other suitable materials. In still other embodiments, the semiconductor substrate 210 may be a silicon on insulator (SOI) substrate. In yet still other embodiments, the semiconductor substrate 210 has a multilayer compound structure.

Isolation features 218 are formed in the semiconductor substrate 210 to separate various non-volatile memory cells. In addition, isolation features 218 are disposed to define and electrically isolate various active regions. Furthermore, each isolation feature 218 has a first depth h1 to achieve desired electrical isolation. Moreover, isolation features 218 may comprise shallow trench isolations (STI) or local oxidation of silicon (LOCOS). Also, the isolation features 218 may comprise silicon oxide (SiOx), silicon nitride (SiN), silicon oxynitride (SiON), an air gap, other suitable materials, or combinations thereof.

The first S/D region 202 and the second S/D region 204 are formed in the semiconductor substrate 210. Either the first S/D region 202 or the second S/D region 204 can be a source region or a drain region of the selection unit 104 as a PMOS, NMOS or CMOS transistor, depending on a voltage level applied thereto. Furthermore, the S/D regions 202 and 204 comprise highly concentrated dopants, and are formed as P-type regions with boron or N-type regions with phosphorus. Additionally, the first S/D region 202 and the second S/D region 204 have a dopant type opposite to that of the semiconductor substrate 210. In an embodiment, the first S/D region 202 is a source region and receives a source line voltage level $V_{SL}$ through the source terminal as shown in FIG. 2A. In addition, the second S/D 204 is a drain region electrically coupled to the second electrode layer 232.

The first S/D region 202 and the second S/D region 204 may be formed by various processes, for example, thermal diffusion process, and implemented by a plurality of operations, such as growing a sacrificial oxide on semiconductor substrate 210, opening a pattern for locations in the first S/D region 202 and the second S/D region 204, implanting impurities and annealing.

The first doped region 212 is disposed in the semiconductor substrate 210 and spaced apart from the drain region 204. In addition, the first doped region 212 is formed of a dopant type different from that of the drain region 204. Referring to FIGS. 2C and 2A, the switching unit 106 comprises a diode having two doped regions with opposite dopant types.

In the present embodiment, the first doped region 212 and the second S/D region 214 are configured as the two doped regions, where the P-type first doped region 212 serves as an anode while and N-type second S/D region 214 serves as a cathode of the switching unit 106. In another embodiment, a second doped region configured as the cathode of the switching unit 106 may be formed separately next to the first doped region 212. In that case, such second doped region may be electrically coupled to the drain region 204 and the second electrode layer 232.

Furthermore, the lightly doped region 214 is disposed between the P-type region 212 and the N-type region 204. The lightly doped region 214 has the same dopant type as the second S/D region 204, for example, an N-type, and has a lower concentration. In addition, the lightly doped region 214 has a doping depth h2 measured from a contact surface between the semiconductor substrate 210 and the first layer 220. The doping depth h2 is made smaller than the first depth h1 such that the lightly doped region 214 would not exceed the bottom of isolation features 218. Hence, the structure of the switching unit 106 including the first doped region 212, the second S/D region 204 and the lightly doped region 214 is maintained within the region defined by the isolation features 218. The device footprint would not be significantly affected by the addition of the switching unit 106.

Another advantage of the lightly doped region 214 is to electrically isolate the switching unit 106 and the selection unit 104. In the present embodiment, the N-type lightly doped region 214 is disposed between the P-type first doped region 212 and the P-type semiconductor substrate 210. Therefore, the forming line terminal FL0 is electrically isolated from the source line SL0 due to the PN junction formed at the boundary between the lightly doped region 214 and neighboring P-type regions. Such an arrangement would ensure separate and isolated current flows in the selection unit 104 and the switching unit 106 for an accessing operation and a forming operation, respectively.

The second layer 220 is disposed over the semiconductor substrate 210. The second layer 220 may be an interlayer dielectric (ILD) layer including a dielectric material 221 and conductive interconnects such as conductors 222, 224, 226 and 228 insulated by the surrounding dielectric 221. Further, the second layer 220 comprises the gate region 206 and the sidewall spaces 208 of the selection unit 104.

The gate region 206 is disposed over the semiconductor substrate 210. The gate region 206 may include a gate dielectric (not shown) disposed on the semiconductor substrate 210 and a gate electrode (not shown) disposed on the gate dielectric. The gate dielectric may include silicon oxide, silicon nitride, silicon oxynitride, and high-k materials. In addition, the gate electrode includes conductive material, such as aluminum, copper, titanium, tantalum, tungsten, molybdenum, tantalum nitride, TiN, WN, TiAl, TiAlN, TaCN, TaC, TaSiN, metal alloys, other suitable materials, and/or combinations thereof. In some embodiments, heavily doped amorphous silicon or polysilicon is alternatively used.

The sidewall spacers 208 are disposed on the semiconductor substrate 210 and configured to separate the gate region 206 from the beneath S/D regions 202 and 204. The sidewall spacers 208 comprise dielectric material such as silicon nitride or silicon oxide. Furthermore, the sidewall spacers 208 may be formed by a deposition process followed by an etching process.

The conductor 222 is disposed on the first S/D region 202. Similarly, the conductor 224 is disposed on the gate region 206. Also, the conductor 228 is disposed on the first doped region 212. The conductors 222, 224, and 228 are configured to electrically couple the source region of the selection unit 104, the gate region 206 and the anode of the switching unit 106 to the source line SL0, the word line WL0 and the forming line FL0, respectively, of the non-volatile memory array 10. In an embodiment, the conductors 222, 224 and 228 are conductive vias or pillars and electrically coupled to input/output pads in the overlaying layers. Alternatively, the conductors 222, 224 and 228 may be formed as or coupled to a source line contact, a word line contact and a forming line contact, respectively. The conductors 222, 224 and 228 may comprise conductive materials such as copper, gold, aluminum and tungsten.

The conductor 226 is disposed in the first layer 220 and configured to electrically couple the second S/D region 204 to the second electrode layer 232 in the overlying second layer 230. The conductor 226 comprises a conductive material similar to the conductors 222, 224 and 228. In addition, all of the conductors 222, 224, 226, and 228 can be formed by a similar process, such as electroplating.

The second layer 230 is disposed on the first layer 220. Referring to FIGS. 2C and 2B, the second layer 230 comprises the first electrode layer 231, the second electrode layer 232 and the variable resistance layer 233 corresponding to the first electrode 121, the second electrode 122 and the variable resistance layer 123, respectively. The second electrode layer 232, the variable resistance layer 233 and the first electrode layer 231 are sequentially formed over the first layer 210 by a suitable process, such as deposition. The second layer 230 may further comprise dielectric materials filling and electrically insulating the embedded layers. Then, the first electrode layer 231 is electrically coupled to the bit line BL0 of the non-volatile memory array 10. In an embodiment, the first electrode layer 231 is coupled to a bit line contact.

Figure 3A:
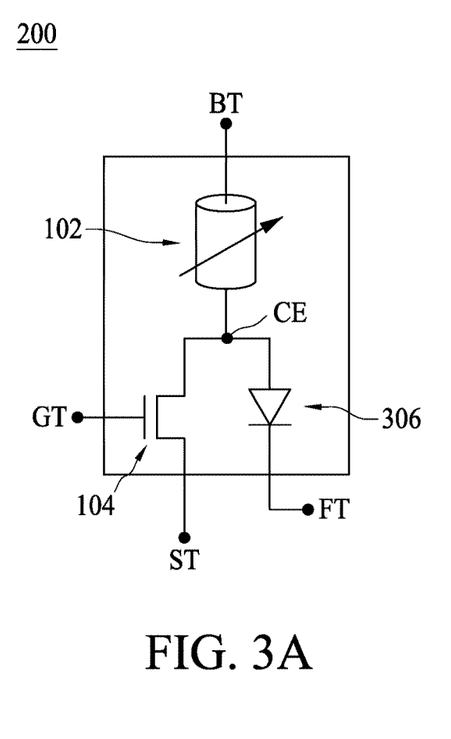
FIG. 3A shows a circuit diagram of a non-volatile memory cell in accordance with some embodiments.

FIG. 3A shows a circuit diagram of a non-volatile memory cell 200 in accordance with some embodiments. Referring to FIG. 3A, the non-volatile memory cell 200 is similar to the non-volatile memory cell 100 described and illustrated with reference to FIG. 2A except that, for example, a switching unit 306 coupled to the data storage unit 102 and the selection unit 104 has flipped polarities with respect to the switching unit 106. Thus, the conducted current flows from the bit line BL0 toward the forming line FL0.

Figure 3B:
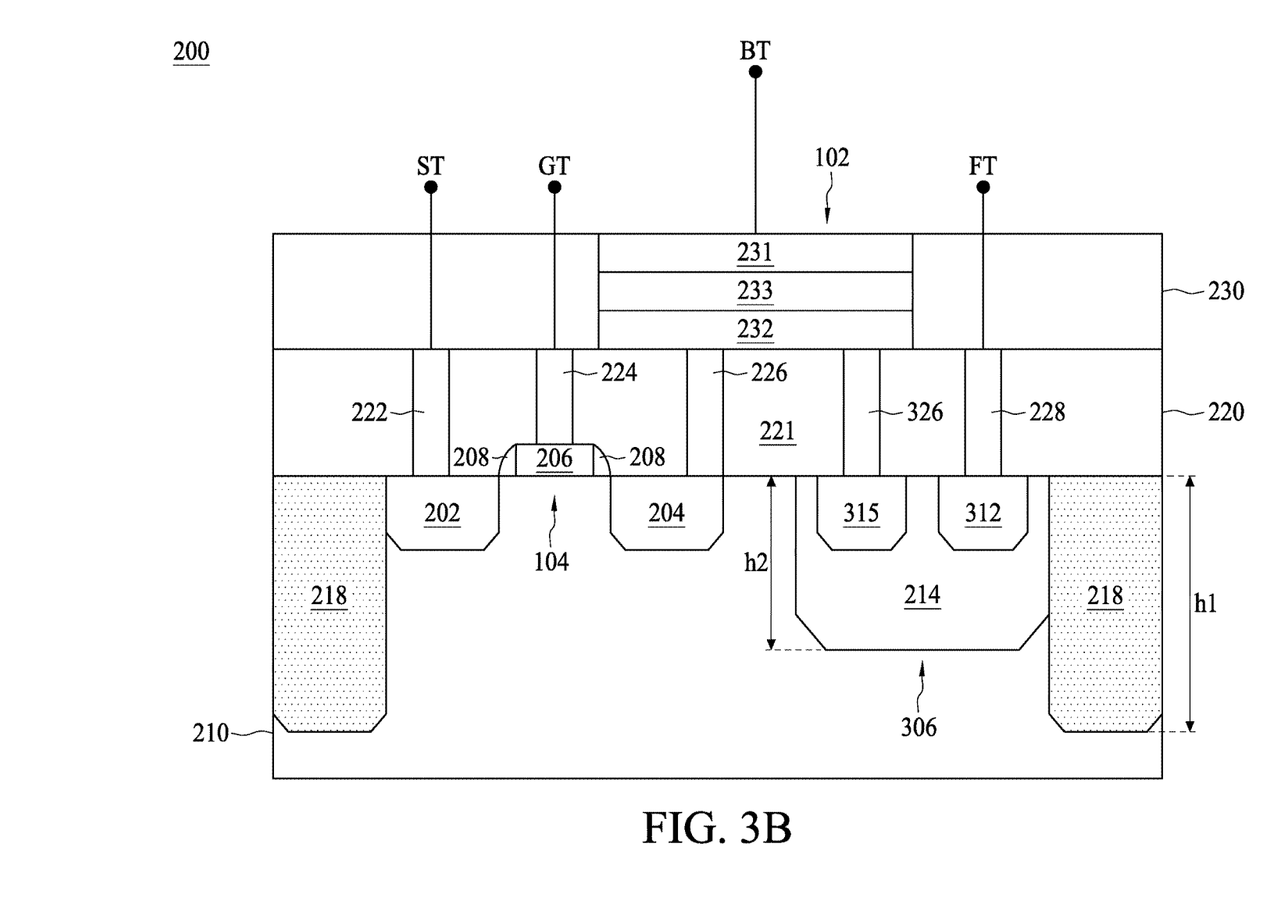
FIG. 3B shows a cross-sectional diagram of the non-volatile memory cell of FIG. 3A, in accordance with some embodiments.

FIG. 3B shows a cross-sectional diagram of the non-volatile memory cell 200 in FIG. 3A, in accordance with some embodiments. Referring to FIG. 3B and also to FIGS. 3A and 2C, the non-volatile memory cell 200 comprises a first doped region 312 and a second doped region 315 serving as the two doped regions representing the cathode and anode of the switching unit 306. Furthermore, the second doped region 315 has a dopant type different from that of the first and second S/D regions 202, 204 and the first doped region 215. For example, the second doped region 315 is a P-type region while the first S/D region 202, the second S/D region 204 and the first doped region 312 are N-type regions. In addition, the N-type lightly doped region 214 is disposed between the second doped region 315 and the first S/D region 202, and thus electrically isolates the source terminal ST from the forming terminal FT.

Figure 4:
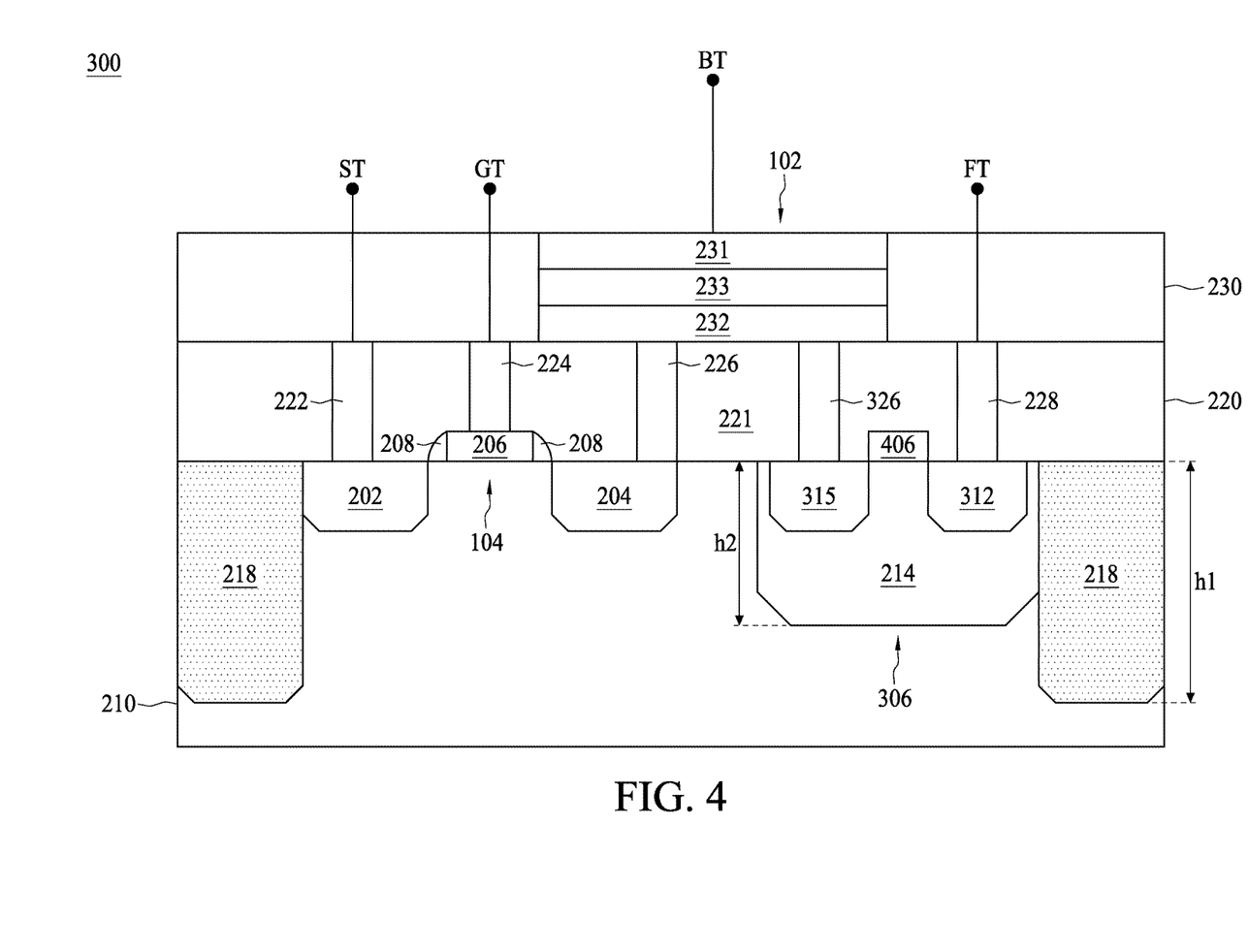
FIG. 4 shows a cross-sectional diagram of a non-volatile memory cell in accordance with some embodiments.

FIG. 4 shows a cross-sectional diagram of a non-volatile memory cell 300 in accordance with some embodiments. The equivalent circuit diagram corresponding to the memory cell 300 may be similar to FIG. 2A or 3A, depending on the polarity of the switching unit. Taking the embodiment of FIG. 3B as an example and comparing FIG. 4B with FIG. 3B, the non-volatile memory cell 300 comprises a second gate region 406 disposed above the first doped region 312 and the second doped region 315. The gate region 406 spaced apart from the gate region 206 is floated in the first layer 220 and is not electrically coupled to any terminals of the non-volatile memory cell 300 such as the bit line, word line, source line or forming line. In addition, the second gate region 406 is configured as a self-aligned gate and serves as a patterning mask for the operation of forming the first doped region 312 and the second doped region 315.

In the present disclosure, a non-volatile memory cell comprises a data storage unit, a selection unit and a switching unit. The data storage unit is configured to store an information bit and has a first end and a second end. The first end is coupled to a bit line. The selection unit is configured to access the data storage unit, and the selection unit has a first end coupled to a select line, a second end coupled to the second end of the data storage unit, and a third end coupled to a source line. The switching unit is configured to perform a formation operation and has a first end coupled to a forming line and a second end coupled to the second end of the data storage unit.

In some embodiments, the data storage unit comprises a first electrode serving as a first terminal of the non-volatile memory cell, a second electrode serving as the second end of the data storage unit, and a variable resistance layer disposed between the first electrode and the second electrode.

In some embodiments, the non-volatile memory cell is configured to perform a formation operation in response to a formation voltage level across the bit line and the forming line.

In an embodiment, the selection unit is configured to be turned off during the formation operation. For example, the first end and the third end of the selection unit respectively serving as a second terminal and a third terminal of the non-volatile memory cell are floated during the formation operation.

In another embodiment, the non-volatile memory cell is configured to perform an access operation in response to a select voltage level from the select line and an access voltage level across the bit line and the source line.

In yet another embodiment, the first end of the switching unit serving as a fourth end of the non-volatile memory cell is floated.

In some embodiments, the select voltage level and the access voltage level for the access operation are lower than a formation voltage level for a formation operation.

In the present disclosure, a non-volatile memory device comprises a semiconductor substrate of a first dopant type, a source region and a drain region. Both the source region and the drain region are of a second dopant type formed in the semiconductor substrate. The non-volatile memory structure also includes a gate region over the source region and the drain region, a variable resistance layer electrically coupled to the drain region, a first doped region, and a second doped region electrically coupled to the variable resistance layer. The non-volatile memory structure further comprises a lightly doped region disposed between the first doped region and the source region, where the lightly doped region is of the second dopant type.

In an embodiment, non-volatile memory device further comprises an isolation region comprising a first depth deeper than a second depth of the lightly doped region.

In another embodiment, the second doped region is electrically coupled to the drain region and the data storage unit. In yet another embodiment, the first doped region is of the first dopant type, the second doped region is of the second dopant type, and the first doped region is floated in an access operation. In an embodiment, the first dopant type is P-type.

In some embodiments, the non-volatile memory device further comprises a second gate region spaced apart from the gate region and floated over the first doped region and the second doped region.

In some embodiments, the non-volatile memory device further comprises a first electrode layer on the variable resistance layer, and the non-volatile memory device is configured to perform a formation operation in response to a formation voltage across the first electrode layer and the first doped region.

In the present disclosure, a non-volatile memory array comprises a plurality of forming lines, a plurality of source lines, a plurality of bit lines, a plurality of word lines; and a plurality of non-volatile memory cells. Each of the non-volatile memory cells comprises a switching unit electrically coupled to a respective one of the plurality of forming lines, a selection unit electrically coupled to a respective one of the plurality of word lines and one of the plurality of source lines, and a data storage unit electrically coupled to a respective one of the plurality of bit lines.

In some embodiments, the selection unit further comprises a gate terminal electrically coupled to one of the plurality of select lines, and a source terminal electrically coupled to one of the plurality of source lines.

In an embodiment, the data storage unit comprises a variable resistance layer formed by a forming voltage level across one of the plurality of the forming lines and one of the plurality of the bit lines.

In some embodiments, each of the plurality of non-volatile memory cells is configured to perform a write and read operation in response to voltage levels received at the respective bit line, word line and source line, and the respective forming line is floated.

In some embodiments, the switching unit comprises a Schottky diode, a metal-insulator-metal device or a silicon-insulator-silicon device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory cell, comprising:
   a data storage unit configured to store an information bit, the data storage unit having a first end and a second end, the first end being coupled to a bit line;
   a selection unit configured to access the data storage unit, the selection unit having a first end coupled to a select line, a second end coupled to the second end of the data storage unit, and a third end coupled to a source line; and
   a switching unit configured to perform a formation operation, the switching unit having a first end coupled to a forming line different from the bit line, the select line and the source line, and a second end coupled to the second end of the data storage unit and the second end of the selection unit.

2. The non-volatile memory cell according to claim 1, wherein the data storage unit comprises:
   a first electrode serving as a first terminal of the non-volatile memory cell;
   a second electrode serving as the second end of the data storage unit; and
   a variable resistance layer disposed between the first electrode and the second electrode.

3. The non-volatile memory cell according to claim 1, configured to perform a formation operation in response to a formation voltage level across the bit line and the forming line.

4. The non-volatile memory cell according to claim 3, wherein the selection unit is configured to be turned off during the formation operation.

5. The non-volatile memory cell according to claim 4, wherein the first end and the third end of the selection unit respectively serving as a second terminal and a third terminal of the non-volatile memory cell are floated during the formation operation.

6. The non-volatile memory cell according to claim 1, configured to perform an access operation in response to a select voltage level from the select line and an access voltage level across the bit line and the source line.

7. The non-volatile memory cell according to claim 6, wherein the first end of the switching unit serving as a fourth end of the non-volatile memory cell is floated.

8. The non-volatile memory cell according to claim 6, wherein the select voltage level and the access voltage level for the access operation are lower than a formation voltage level for a formation operation.

9. A non-volatile memory device, comprising:
   an array of memory cells, each of the memory cells including a transistor, a data storage unit and a diode on a semiconductor substrate of a first dopant type,
   wherein the transistor comprises:
      a source region and a drain region, both of a second dopant type formed in the semiconductor substrate, the source region being electrically coupled to a source line; and
      a gate region over the source region and the drain region, the gate region being electrically coupled to a select line;
   wherein the data storage unit comprises a variable resistance layer electrically coupled to the drain region of the transistor and a bit line; and
   wherein the diode comprises:
      a first doped region electrically coupled to a forming line different from the source line, the select line and the bit line;
      a second doped region electrically coupled to the variable resistance layer of the data storage unit; and
      a lightly doped region disposed between the second doped region and the source region of the transistor, the lightly doped region being of the second dopant type.

10. The non-volatile memory device according to claim 9, further comprising an isolation region disposed in the semiconductor substrate and comprising a first depth greater than a second depth of the lightly doped region of the diode.

11. The non-volatile memory device according to claim 9, wherein the second doped region of the diode is electrically coupled to the drain region of the transistor and to the variable resistance layer of the data storage unit.

12. The non-volatile memory device according to claim 9, wherein the first doped region of the diode is of the first dopant type, and the second doped region of the diode is of the second dopant type.

13. The non-volatile memory device according to claim 9, wherein the first dopant type is P-type.

14. The non-volatile memory device according to claim 9, wherein the diode further comprises a second gate region spaced apart from the gate region of the transistor and floated over the first doped region and the second doped region.

15. The non-volatile memory device according to claim 9, wherein the data storage unit further comprises a first electrode layer on the variable resistance layer, and the non-volatile memory device is configured to perform a formation operation in response to a formation voltage across the first electrode layer of the data storage unit and the first doped region of the diode.

16. A non-volatile memory array, comprising:
    a plurality of forming lines;
    a plurality of source lines;
    a plurality of bit lines;
    a plurality of word lines, wherein each of the plurality of forming word lines, each of the plurality of forming lines, each of the plurality of source lines and each of the plurality of bit lines are different from one another; and
    a plurality of non-volatile memory cells each of the non-volatile memory cells comprising:
        a switching unit electrically coupled to a respective one of the plurality of forming lines;
        a selection unit comprising a first terminal electrically coupled to a respective one of the plurality of word lines a second terminal coupled to a respective one of the plurality of source lines, and a third terminal coupled to the switching unit; and
        a data storage unit electrically coupled to a respective one of the plurality of bit lines.

17. The non-volatile memory array according to claim 16, wherein the selection unit is a MOS transistor or a bipolar junction transistor.

18. The non-volatile memory cell array according to claim 16, wherein the data storage unit comprises a first electrode, a second electrode, and a variable resistance layer between the first electrode and the second electrode.

19. The non-volatile memory cell array according to claim 16, wherein each of the plurality of non-volatile memory cells is configured to perform a write and read operation in response to voltage levels received at the respective bit line, word line and source line, and the respective forming line is floated.

20. The non-volatile memory cell array according to claim 16, wherein the switching unit comprises a Schottky diode, a metal-insulator-metal device or a silicon-insulator-silicon device.

* * * * *